US011323109B2

(12) United States Patent
Manian et al.

(10) Patent No.: US 11,323,109 B2
(45) Date of Patent: May 3, 2022

(54) SELF-REFERENCED CLOCKLESS DELAY ADAPTATION FOR RANDOM DATA (71) Applicant: TEXAS INSTRUMENTS INCORPORATED, Dallas, TX (US)

(72) Inventors: Abishek Manian, San Jose, CA (US); Surya Theja Golakonda, Tempe, AZ (US); Robin Gupta, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/084,901

(22) Filed: Oct. 30, 2020

(65) Prior Publication Data

US 2021/0409014 A1  Dec. 30, 2021

Related U.S. Application Data (60) Provisional application No. 63/045,439, filed on Jun. 29, 2020.

(51) Int. Cl.
*H03K 5/14* (2014.01)
*H03L 7/081* (2006.01)
*H03K 5/00* (2006.01)
*H03K 19/20* (2006.01)

(52) U.S. Cl.
CPC ............. *H03K 5/14* (2013.01); *H03L 7/0812* (2013.01); *H03K 19/20* (2013.01); *H03K 2005/00156* (2013.01); *H03K 2005/00195* (2013.01)

(58) Field of Classification Search
CPC ............ H03K 5/14; H03K 19/20; H03K 5/06;
H03K 5/1504; H03K 9/215; H03K 5/135;
H03K 5/13; H03L 7/0812; H03L 7/093;
H03L 7/0814; H03L 7/091; H03L 7/0818;
(Continued)

(56) References Cited

U.S. PATENT DOCUMENTS 5,570,052 A * 10/1996 Fonderie ................ H03K 5/082
327/205
6,680,634 B1  1/2004 Ruha
9,231,793 B1  1/2016 Vareljian
(Continued)

OTHER PUBLICATIONS

International Search Report in corresponding PCT Application No. PCT/US2020/061021, dated Feb. 18, 2021 (2 pages).

*Primary Examiner* — John W Poos
(74) *Attorney, Agent, or Firm* — John R. Pessetto; Charles A. Brill; Frank D. Cimino (57) ABSTRACT

A clockless delay adaptation loop configured to adapt to random data includes a first and a second delay line, an autocorrelator, and a controller. The autocorrelator receives an input signal for the delay adaptation loop and the output from the first delay line, and includes a first logic circuit configured to output a first autocorrelation and a second logic circuit configured to output a second autocorrelation. The controller is configured generate a control signal for one of the first and second delay lines based on the first and second autocorrelations. In some examples, the first logic circuit is an XNOR gate, and the second logic circuit is an OR gate. In some examples, the OR gate can have a gain that is two times a gain of the XNOR gate. In some examples, an amplifier having two times the gain of the XNOR gate is coupled to the OR gate.

25 Claims, 6 Drawing Sheets

(58) Field of Classification Search
CPC ....... H03L 7/0805; H03L 7/06; H03L 7/0995; H03L 7/0807; H03L 7/087
See application file for complete search history.

(56) References Cited

U.S. PATENT DOCUMENTS

| | | | |
|---|---|---|---|
| 9,552,003 B2* | 1/2017 | Madsen | H03F 3/393 |
| 10,236,897 B1 | 3/2019 | Manian | |
| 10,560,105 B1* | 2/2020 | Sun | H04L 7/0037 |
| 10,897,245 B1* | 1/2021 | Manian | H03K 19/215 |
| 2005/0140415 A1* | 6/2005 | Hazucha | H03K 5/135 |
| | | | 327/276 |
| 2008/0136476 A1* | 6/2008 | Ku | H03L 7/0814 |
| | | | 327/158 |
| 2010/0098147 A1 | 4/2010 | Miller | |
| 2010/0283520 A1* | 11/2010 | Ku | H03L 7/0814 |
| | | | 327/158 |
| 2010/0295588 A1* | 11/2010 | Choi | H03L 7/0814 |
| | | | 327/158 |
| 2016/0134292 A1 | 5/2016 | Wu | |

* cited by examiner

SELF-REFERENCED CLOCKLESS DELAY ADAPTATION FOR RANDOM DATA

CROSS-REFERENCE TO RELATED APPLICATION

This application claims priority to U.S. Provisional Application 63/045,439, filed Jun. 29, 2020, titled "Self-Referenced Clockless Delay Adaptation for Random Data," which is hereby incorporated by reference in its entirety.

BACKGROUND

Equalization is a process of conditioning an electrical signal, either at the transmitter or the receiver to compensate for channel-induced inter-symbol-interference (ISI) and improve signal integrity. One non-linear equalization technique is referred to as decision-feedback equalization (DFE). In DFE, a delay element is introduced into the receiver circuitry, and equalization values are combined with an input data stream. In many applications (e.g., re-drivers), a clock is not available and thus a clockless delay line (to delay the random data) is needed. The delay needs to be adapted automatically to one unit interval (UI) or multiples of one UI for a range of permissible data rates.

Some clockless delay adaptation loops configured to adapt to random data include an autocorrelation control circuit that compares an autocorrelation of the input signal with a reference voltage and outputs a control signal for the delay line based on the comparison. However, the autocorrelation of the input signal can vary in response to voltage and temperature variations, which in turn leads to variation in the adapted delay. In addition, supplying a reference voltage to the autocorrelation control circuit can increase the area and complexity of the clockless delay adaptation loop.

SUMMARY

A clockless delay adaptation loop configured to adapt to random data includes two delay lines, an autocorrelator, and a controller. The first delay line receives an input signal and outputs a first delayed signal. The second delay line receives the first delayed signal and outputs a second delayed signal. The autocorrelator receives the input signal and the first delayed signal, and includes an XNOR gate and an OR gate. The XNOR gate outputs a first autocorrelation, and the OR gate outputs a second autocorrelation. The controller generates a control signal for at least one of the delay lines based on the first and second autocorrelations.

In some examples, the control signal causes the at least one of the delay lines to a delay value of one half of a unit interval. The OR gate can have a gain that is two times a gain of the XNOR gate or be coupled to an amplifier that has a gain that is two times the gain of the XNOR gate. In some examples, the controller includes a transconductance stage and a capacitor. The transconductance stage receives the first autocorrelation at a positive input and the second autocorrelation at a negative input and outputs the control signal. The capacitor is coupled to the output of the transconductance stage and to ground.

The control signal can be an analog control signal in some examples, and the controller can include a first counter that receives the first autocorrelation and a second counter that receives the second autocorrelation. The second counter doubles the count of the second autocorrelation, in some examples. An accumulator and comparator in the controller outputs a digital control signal based on the outputs from the first and second counters. In some examples, a digital-to-analog converter converts the digital control signal into the analog control signal. In some examples, the first and second delay lines comprise digital-controlled delay lines and receive the digital control signal.

In some examples, the delay adaptation loop generates a first control signal for the first delay line and also includes a second autocorrelator and a second controller to generate a second control signal for the second delay line. In some examples, the delay adaptation includes a second autocorrelator that receives the first delayed signal and the second delayed signal. The second autocorrelator includes a second XNOR gate that outputs a third autocorrelation and a second OR gate that outputs a fourth autocorrelation. A first summer receives the first and third autocorrelations, and a second summer receives the second and fourth autocorrelations. The controller generates the control signal based on the outputs of the first and second summers.

In some examples, at least one of the first and second delay lines includes a voltage-to-current converter and a differential amplifier. The voltage-to-current converter receives the control signal and generates a control current. The differential amplifier delays a signal input to the delay line based on the control signal and the control current. In some examples, the voltage-to-current converter includes an operational amplifier (op-amp), three transistors, two resistors, and a current source. A negative input of the op-amp receives the control signal, and the control terminals of the first and second transistors receive an output of the op-amp. The current terminals of the first transistor are coupled to a positive input of the op-amp and to ground. The first resistor is coupled to a supply voltage rail and to the positive input of the op-amp and one of the current terminals of the first transistor. The current terminals of the second transistor are coupled to the current source and to ground. One of the current terminals of the third transistor is coupled to the current source, one of the current terminals of the second transistor, and the control terminal of the third transistor. The other current terminal of the third transistor is coupled to the second resistor, which is further coupled to ground.

BRIEF DESCRIPTION OF THE DRAWINGS

For a detailed description of various examples, reference will now be made to the accompanying drawings in which.

DETAILED DESCRIPTION

Disclosed herein are delay adaptation loop topologies that employ an autocorrelation function. In the presence of inter-symbol interference (ISI), the autocorrelation function may have a non-zero tail that exceeds a time shift of one UI. A more robust option involves locking to 0.5 UI by forcing the autocorrelation function towards 0.5 (instead of 0). Instead of comparing the autocorrelation to a reference voltage, the delay adaptation loops described herein calculate the autocorrelation using two different methods that intersect at 0.5 UI and compare the two autocorrelations to each other.

As described herein, example delay elements include voltage-controlled delay lines (VCDLs) controlled by an autocorrelator and a controller. The autocorrelator includes an XNOR gate and an OR gate, both of which receive input data provided to and delayed data output from a VCDL. In some embodiments, the OR gate has a gain that is two times a gain of the XNOR gate. In some embodiments, the OR gate has a gain that is substantially the same as the gain of the XNOR gate and is coupled to an amplifier, which has a gain that is two times the gain of the XNOR gate. The controller compares an output from the XNOR gate and an output from the OR gate, and generates a control signal for one or more of the VCDLs in the delay loop.

Figure 1:
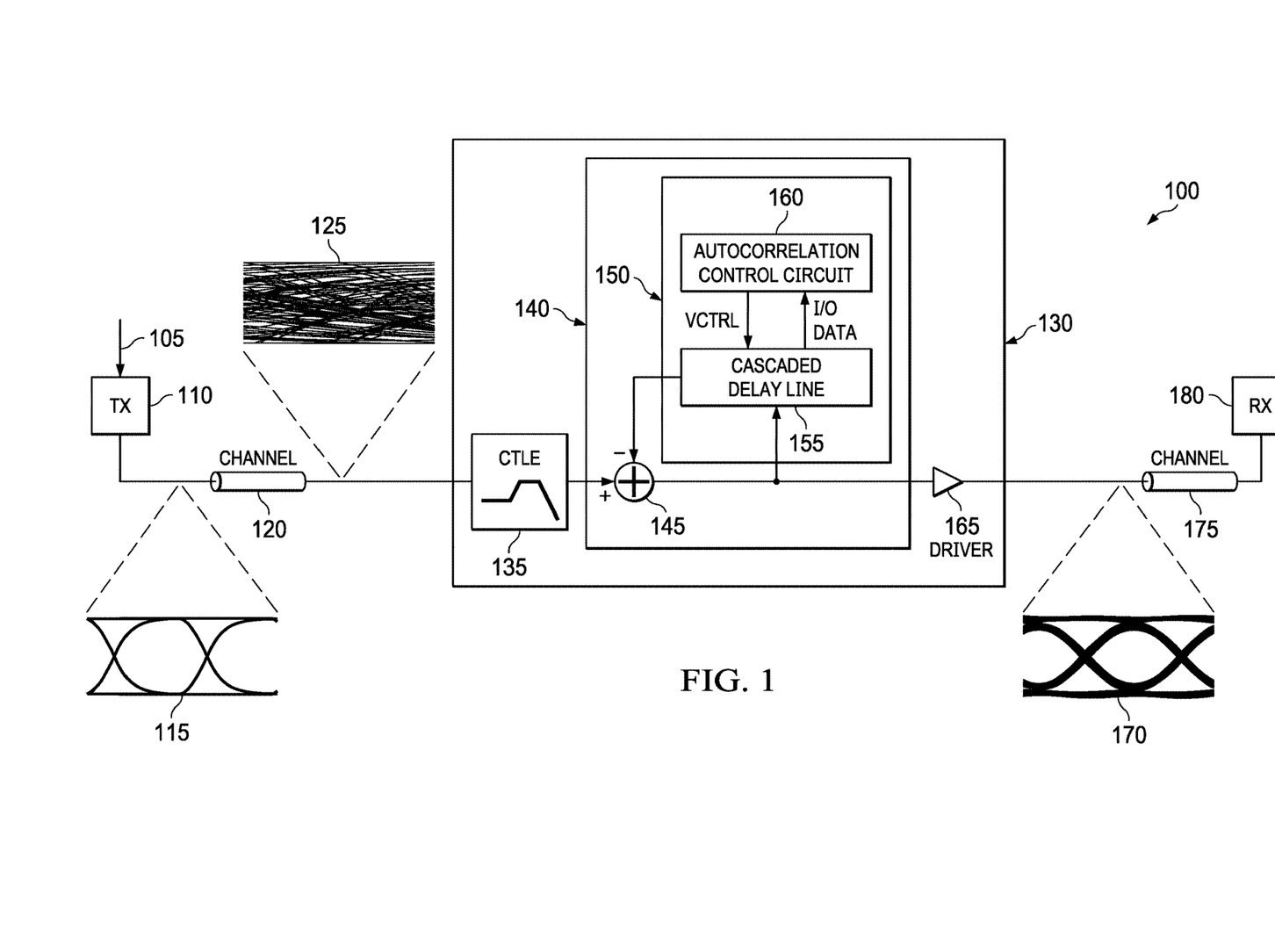
FIG. 1 illustrates an example communication system including a repeater or redriver.

FIG. 1 illustrates an example communication system 100 including a repeater or redriver 130. In addition to the redriver 130, communication system 100 includes a transmitter 110, a first channel 120, the repeater or redriver 130, a second channel 175, and a receiver 180. A transmission signal 105 is output from the transmitter 110 and represented by transmitted signal eye diagram 115. After conveyance via the first channel 120, the transmission signal 105 is no longer distinguishable as represented by the received signal eye diagram 125. The repeater or redriver 130 is used to recover the transmission signal 105 from the transmitter 120 and to repeat that signal using a driver 165. The signal repeated by the driver 165 is represented by the recovered signal eye diagram 170. The recovered signal is transmitted by the driver 165 to receiver 180 through the second channel 175. The channels 120 and 175 represent physical transmission mediums (e.g., cablers, board traces, optical fiber, etc.) used to convey signals between the transmitter 110 and the repeater or redriver 130 and between the redriver 130 and the receiver 180.

In the example of FIG. 1, the repeater or redriver 130 includes a continuous time linear equalizer (CTLE) 135 and a clockless DFE loop 140. The equalization operations of the CTLE 135 and the clockless DFE loop 140 facilitate recovery of the transmission signal 105. In the example of FIG. 1, the DFE loop 140 includes a summer 145 and a delay adaptation loop 150 with a cascaded delay line 155 and an autocorrelation control circuit 160. In some examples, the cascaded delay line 155 includes at least one VCDL and a DFE tap circuit. In clockless DFE loop 140, summer 145 subtracts an output of the delay adaptation loop 150 from the output of the CTLE 135, and provides the difference to the driver 165 and the delay adaptation loop 150. In the delay adaptation loop 150, the autocorrelation control circuit 160 receives input/output data from the cascaded delay line 155 and correlates the input/output data. The correlation is used to generate a control signal Vctrl for the cascaded delay line 155.

Figure 2:
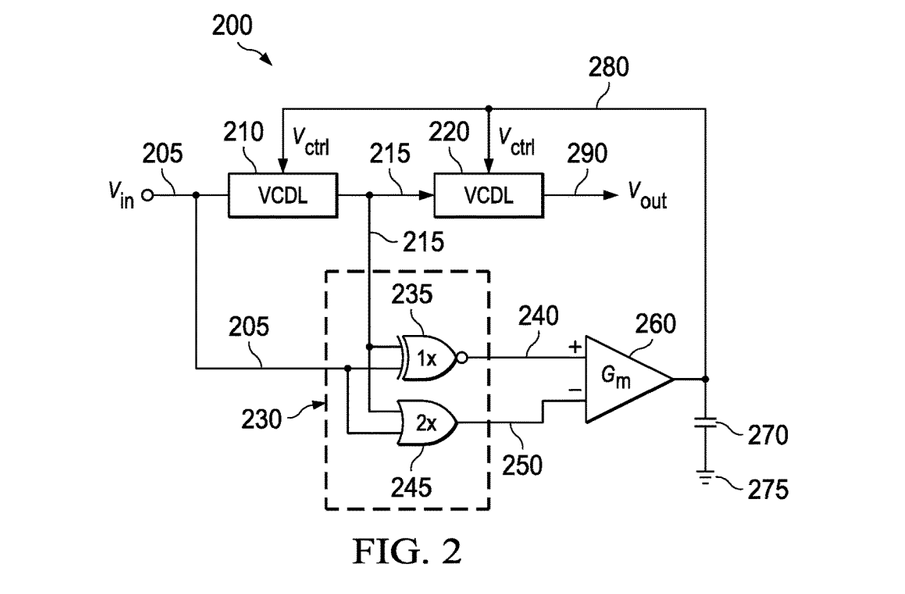
FIG. 2 illustrates an example delay adaptation loop.

FIG. 2 illustrates an example delay adaptation loop 200, which may be used in place of delay adaptation loop 150 shown in FIG. 1. The delay adaptation loop 200 includes a first VCDL 210, a second VCDL 220, an autocorrelator 230, a transconductance stage 260, and a capacitor 270. The transconductance stage 260 and capacitor 270 can be considered a controller. Although the delay lines 210 and 220 are VCDLs in this example, any appropriate delay line such as a current-controlled delay line or a digital-controlled delay line can be used in place of or in combination with VCDLs 210 and 220. An input Vin 205 such as the output of summer 145 shown in FIG. 1 is provided to autocorrelator 230 and to VCDL 210, which outputs a delayed signal 215. The delayed signal 215 is provided to the autocorrelator 230 and to VCDL 220, which outputs an output signal Vout 290. The outputs 240 and 250 from autocorrelator 230 are provided to transconductance stage 260. The output Vctrl 280 of transconductance stage 260 is integrated using capacitor 270, which is further coupled to ground 275. Vctrl 280 is provided to VCDLs 210 and 220 to adjust the delays implemented by the VCDLs 210 and 220.

The autocorrelator 230 includes an XNOR gate 235 and an OR gate 245, both of which receive Vin 205 and delayed signal 215. The OR gate 245 can be configured to implement a gain two times the gain of the XNOR gate 235. The output 240 from XNOR gate 235 is provided to a positive input of the transconductance stage 260, and the output 250 from OR gate 245 is provided to a negative input of the transconductance stage 260. Instead of comparing to a reference voltage, the autocorrelation output 240 from XNOR gate 235 is compared to the autocorrelation output 250 from OR gate 245. The XNOR gate 235 and OR gate 245 can be implemented such that they match over process, voltage, and temperature (PVT) variations, which reduces variation in the adapted delay over PVT variations compared to a delay adaptation loop with a reference voltage.

Figure 3:
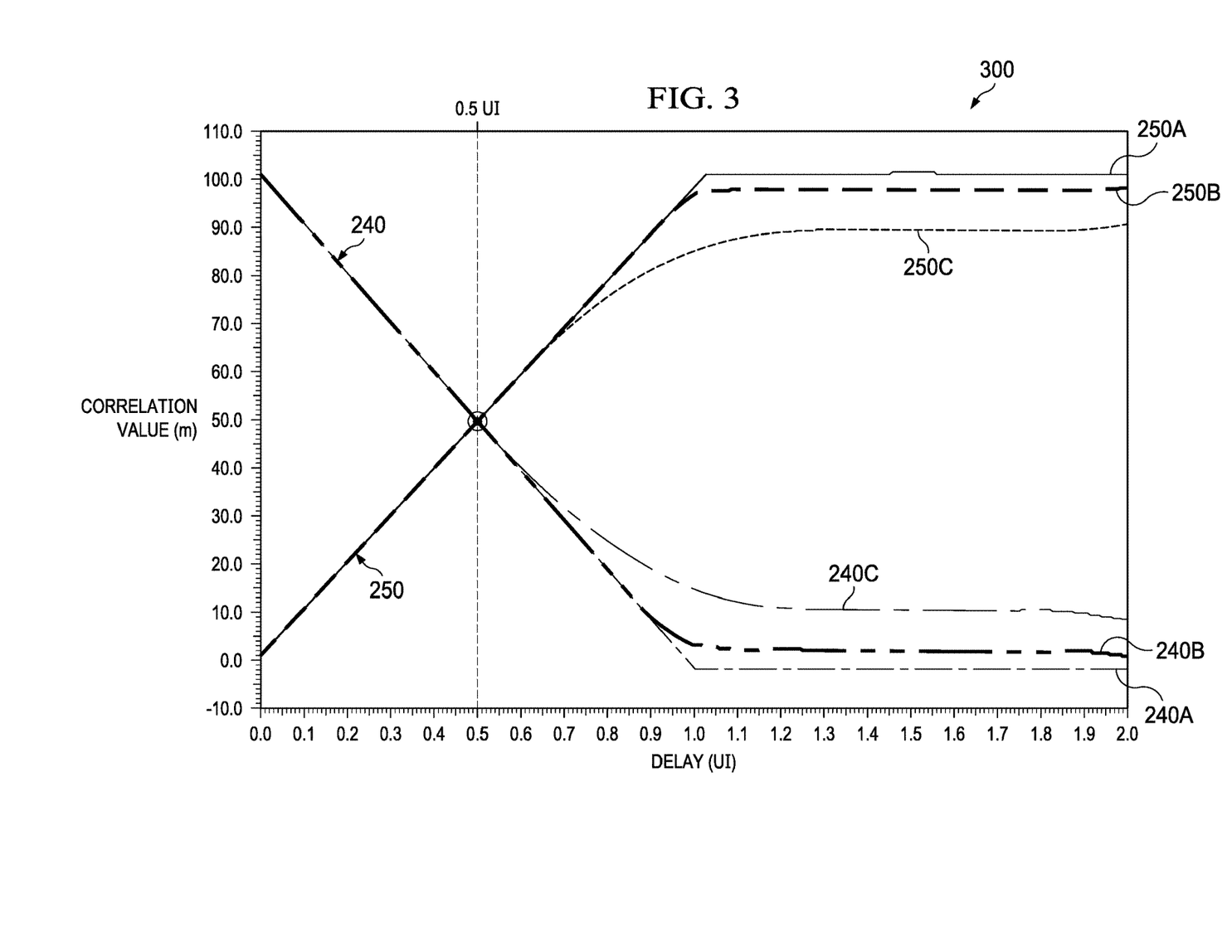
FIG. 3 shows a graph of an autocorrelation using an XNOR gate and an autocorrelation using an OR gate.

FIG. 3 shows a graph 300 of an autocorrelation 240 using the XNOR gate 235 and an autocorrelation 250 using the OR gate 245 with two times the gain of XNOR gate 235. For a random data stream Vin 205, the average of the XNOR 235 of the data Vin 205 and the delayed data 215 decreases with increasing delay and flattens out while the delay exceeds one UI. Similarly, the average of the OR 245 of the data Vin 205 and the delayed data 215 increases with increasing delay and flattens out while the delay exceeds one UI. The autocorrelations 240A-C using the XNOR gate 235 represent different channel losses and diverge as the delay approaches and exceeds one UI. Similarly, the autocorrelations 250A-C using the OR gate 245 represent different channel losses and diverge as the delay approaches and exceeds one UI. Despite the variations due to different channel losses, the average of the XNOR and two times the average of the OR intersect at approximately 0.5 UI, allowing the Vctrl 280 to control the VCDLs 210 and 220 to each implement a 0.5 UI delay such that the overall delay of the cascaded VCDLs 210 and 220 is one UI.

Figure 4:
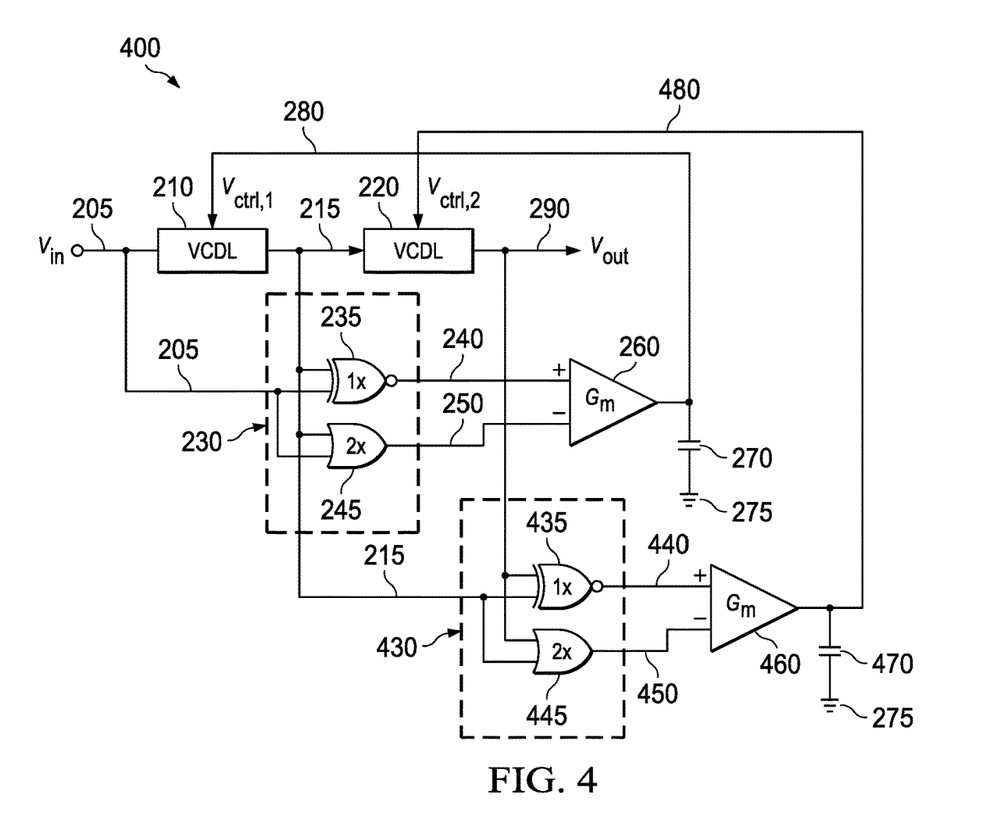
FIG. 4 illustrates an example delay adaptation loop with independent autocorrelators for each delay line.

FIG. 4 illustrates an example delay adaptation loop 400 with independent autocorrelators for each VCDL. Separate autocorrelators and control loops for each VCDL allows the delay implemented by each VCDL to be adjusted to 0.5 UI independently of the others. Delay adaptation loop 400 is substantially the same as delay adaptation loop 200 shown in FIG. 2, but also includes a second autocorrelator 430, a second transconductance stage 460, and a second capacitor 470. Transconductance stage 260 outputs a control signal Vctrl,1 280 to VCDL 210 but not VCDL 220.

The second autocorrelator 430 includes a second XNOR gate 435 and a second OR gate 445, which is configured to implement a gain that is two times the gain of the XNOR gate 435. The XNOR gate 435 and the OR gate 445 each receive the delayed signal 215 and the output Vout 290. The output 440 from XNOR gate 435 is provided to a positive input of the second transconductance stage 460, and the output 450 from OR gate 445 is provided to a negative input of the second transconductance stage 460. The output Vctrl,2 480 from the second transconductance stage is integrated using capacitor 470, which is further coupled to ground 275. The output Vctrl,2 480 is provided to the second VCDL 220.

Figure 5:
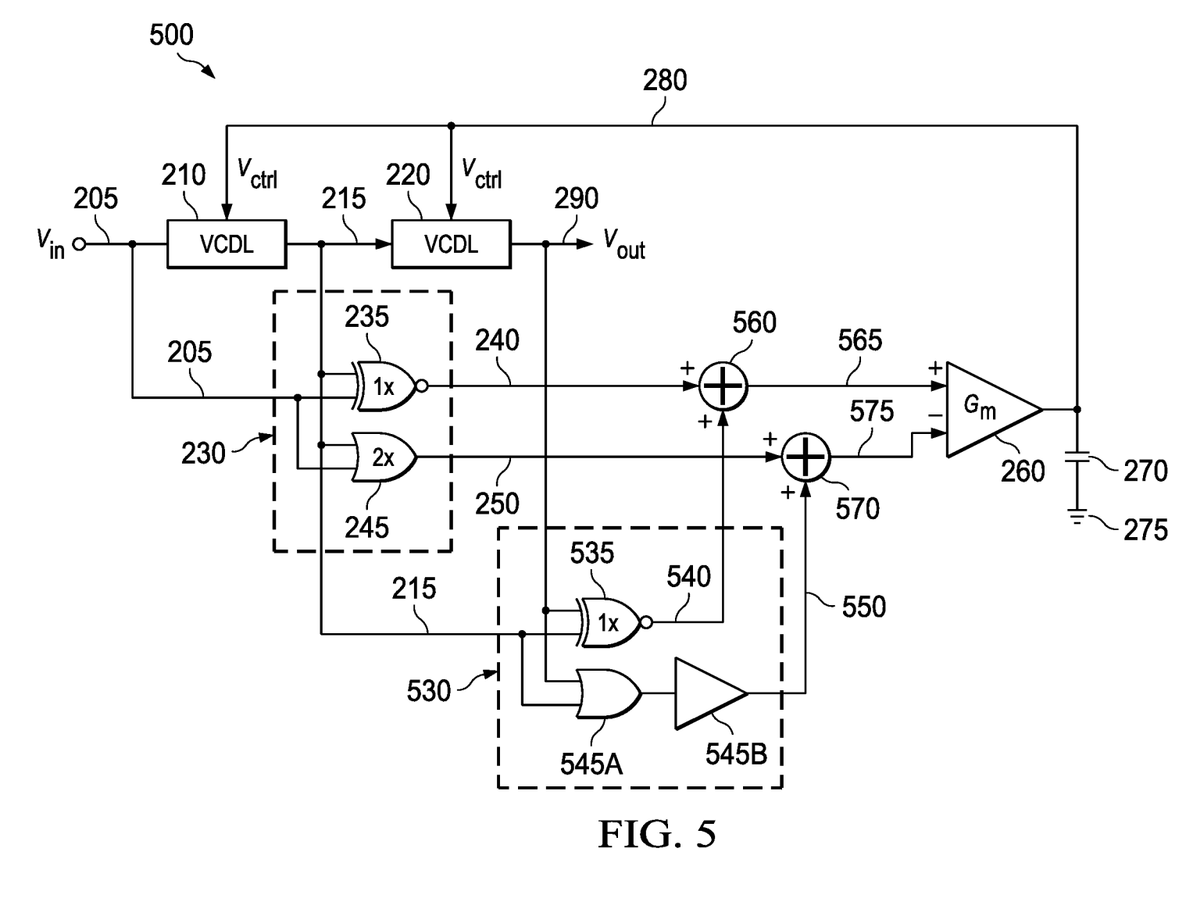
FIG. 5 illustrates an example delay adaptation loop with a single transconductance stage and a single integrating capacitor for both delay lines.

FIG. 5 illustrates an example delay adaptation loop 500 with a single transconductance stage and a single integrating capacitor for both VCDLs. Using the same transconductance stage and integrating capacitor for both VCDLs reduces power consumption and area. Depending on mismatch between the VCDLs, the VCDLs can lock slightly above or below 0.5 UI, while the overall delay across both VCDLs locks to one UI. Delay adaptation loop 500 is substantially the same as delay adaptation loop 200 shown in FIG. 2, but also includes a second autocorrelator 530, and summers 560 and 570.

The second autocorrelator 530 includes a second XNOR gate 535, a second OR gate 545A, and an amplifier 545B. The OR gate 545A implements a gain that is approximately equal the gain of the XNOR gate 535 and is coupled to amplifier 545B, which has a gain that is two times the gain of the XNOR gate 535. The output 240 from XNOR 235 and the output 540 from XNOR 535 are added together by summer 560. The output 565 of summer 560 is provided to a positive input of transconductance stage 260. The output 250 from OR 245 and the output 550 from amplifier 545B are added together by summer 570. The output 575 of summer 570 is provided to a negative input of transconductance stage 260.

Figure 6:
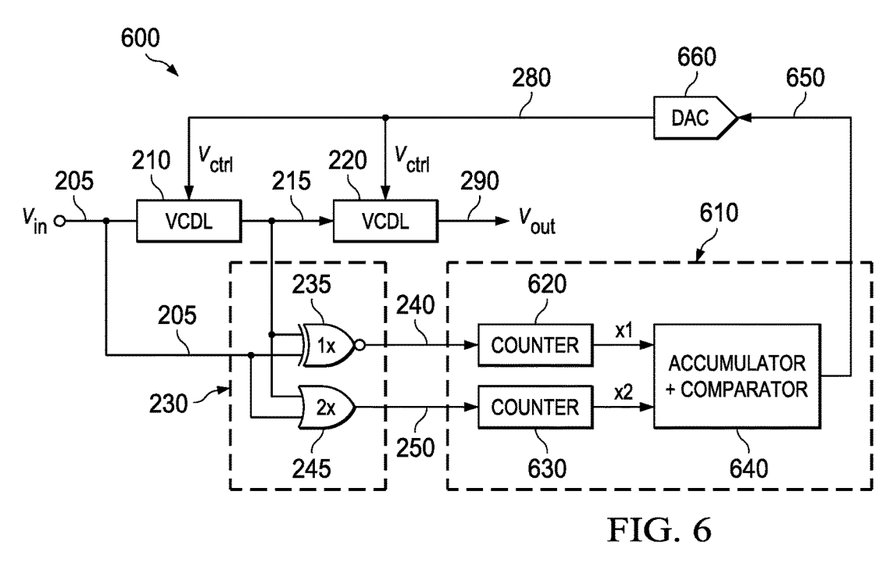
FIG. 6 illustrates an example delay adaptation loop with a digital autocorrelation controller.

FIG. 6 illustrates an example delay adaptation loop 600 with a digital feedback loop 610. The delay adaptation loop 600 is substantially the same as delay adaptation loop 200 shown in FIG. 2, but includes the digital feedback loop 610 and digital-to-analog converter (DAC) 660 as the controller, instead of transconductance stage 260 and capacitor 270. The digital feedback loop 610 includes a first counter 620, a second counter 630, and an accumulator and comparator 640. The first counter 620 receives the output 240 from XNOR gate 235, and the second counter 630 receives the output 250 from OR gate 240. In this example, OR gate 245 has substantially the same gain as XNOR gate 235. The second counter 630 is configured to double the count from output 250. The outputs of counters 620 and 630 are provided to the accumulator and comparator 640. The output 650 is provided to DAC 660, which outputs Vctrl 280 to VCDL 210 and 220.

Figure 7:
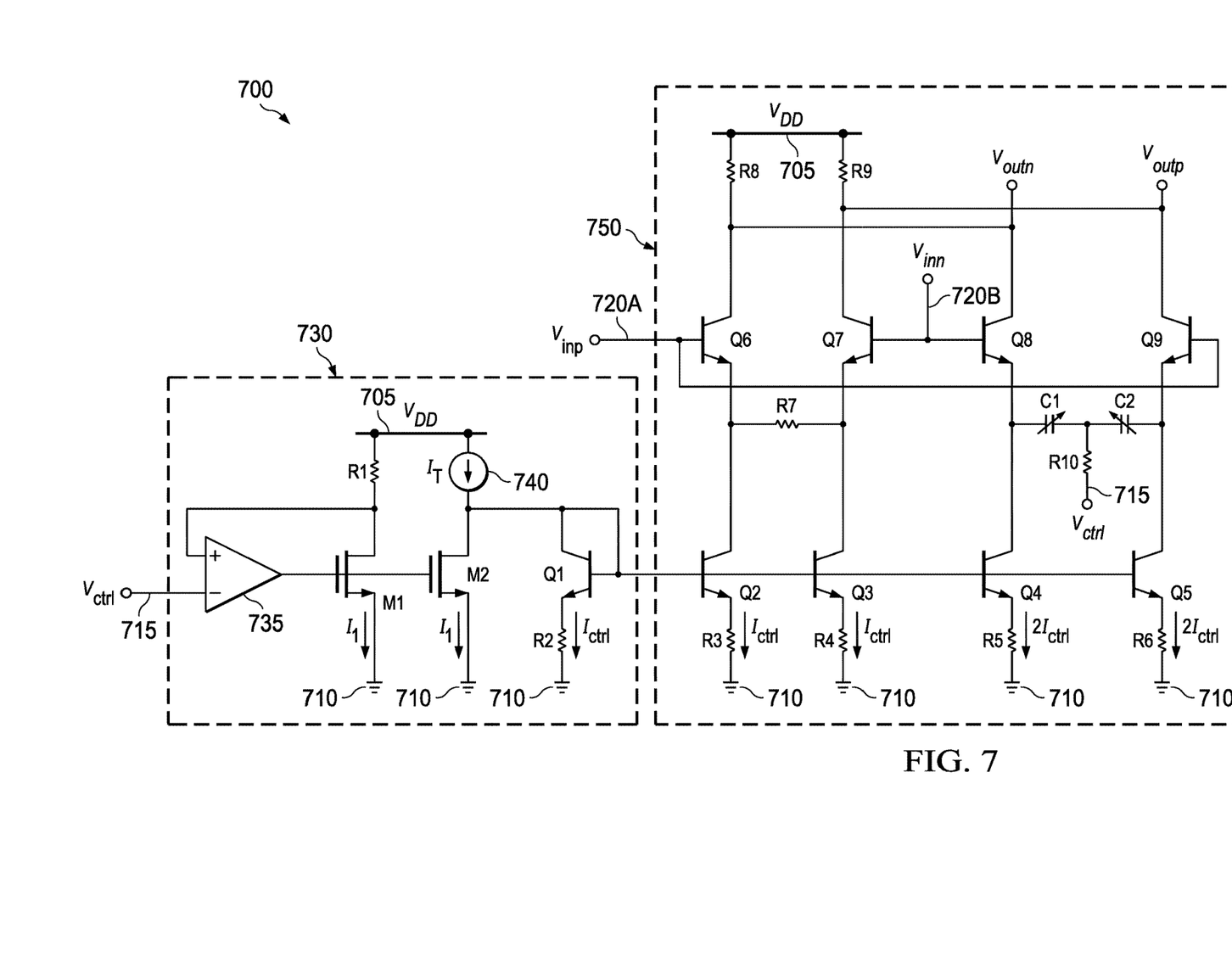
FIG. 7 illustrates an example voltage-controlled delay line.

FIG. 7 illustrates an example voltage-controlled delay line 700, which includes a voltage-to-current (V-I) converter 730 and a differential amplifier 750. The V-I converter 730 includes n-type metal oxide semiconductor field-effect transistors (MOSFETs) M1 and M2, and a bipolar junction transistor (BJT) Q1. The differential amplifier 750 includes BJTs Q2-Q9. M1 and M2 are n-type MOSFETs (NMOS) in this example. In other examples, one or more of M1 and M2 are p-type MOSFETs (PMOS) or BJTs. Q1-Q9 are BJTs in this example. In other examples, Q1-Q9 are MOSFETs. A BJT includes a base corresponding to a gate terminal, and a collector and an emitter corresponding to the drain and source terminals. The base of the BJT and the gate terminal of a MOSFET are also called control inputs. The collector and emitter of a BJT and the drain and source terminals of a MOSFET are also called current terminals.

In addition to M1-M2 and Q1, the V-I converter 730 includes an operational amplifier (op-amp) 735, resistors R1 and R2, and a current source 740. The resistor R1 is coupled between a voltage supply rail Vdd 705 and a drain terminal of M1. A source terminal of M1 is coupled to ground 710. The current source 740 is coupled between the voltage supply rail Vdd 705 and the drain terminal of M2. The source terminal of M2 is coupled to ground 710. The base and collector terminals of Q1 are also coupled to the current source 740 and the drain terminal of M1. The emitter terminal of Q1 is coupled to R2, which is further coupled to ground 710.

The gate terminals of M1 and M2 are coupled to an output of op-amp 735. The positive input of op-amp 735 is coupled to R1 and the drain terminal of M1. The negative input of op-amp 735 is configured to receive the control signal Vctrl 715, such as from the DAC 660 shown in FIG. 6 or the transconductance stage 260 shown in FIG. 2. The current source 740 is configured to generate a current It. The current I1 through M1 and M2 is represented as:

$$\frac{Vdd705 - Vctrl715}{R1}.$$

The current Ictrl through Q1 is represented as:

$$It - \frac{Vdd705}{R1} + \frac{Vctrl715}{R1}.$$

The current It from current source 740 and (Vdd 705/R1) are constant.

Q1 in V-I converter 730 is part of a current mirror with BJTs Q2-Q5 in differential amplifier 750. Q2 and Q3 generate a copy of Ictrl, and Q4 and Q5 generate a current that is two times Ictrl. R10 is coupled to a node to which Vctrl 715 is applied and to voltage-dependent capacitors (varactors) C1 and C2. C1 is further coupled to the source terminal of Q8, and C2 is further coupled to the source terminal of Q9. The delay of differential amplifier 750 can be tuned by adjusting the capacitances of varactors C1 and C2 based on Vctrl 715. For a higher tuning range, Ictrl is generated as a function of Vctrl 715 using V-I converter 730.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A clockless delay adaptation loop configured to adapt to random data, comprising:
   a first delay line configured to receive an input signal and output a first delayed signal;
   a second delay line configured to receive the first delayed signal and output a second delayed signal;
   an autocorrelator configured to receive the input signal and the first delayed signal, wherein the autocorrelator comprises:
   a first logic circuit configured to output a first autocorrelation; and
   a second logic circuit configured to output a second autocorrelation; and a controller configured to generate a control signal for at least one of the first and second delay lines based on the first and second autocorrelation.

2. The clockless delay adaptation loop of claim 1, wherein the first logic circuit comprises an XNOR gate, and wherein the second logic circuit comprises an OR gate.

3. The clockless delay adaptation loop of claim 2, wherein the OR gate is further configured to implement a gain that is two times a gain of the XNOR gate.

4. The clockless delay adaptation loop of claim 2, further comprising an amplifier having a gain that is two times a gain of the XNOR gate, wherein the OR gate has a gain that is approximately equal to the gain of the XNOR gate.

5. The clockless delay adaptation loop of claim 1, wherein the controller comprises:
a transconductance stage configured to:
receive the first autocorrelation at a positive input and the second autocorrelation at a negative input; and
output the control signal for the at least one of the first and second delay lines; and
a capacitor coupled to an output of the transconductance stage and to ground.

6. The clockless delay adaptation loop of claim 1, wherein the control signal comprises an analog control signal, wherein the controller comprises:
a first counter configured to receive the first autocorrelation;
a second counter configured to receive the second autocorrelation;
an accumulator and comparator configured to:
receive outputs from the first and second counters; and
output a digital control signal; and
a digital-to-analog converter configured to convert the digital control signal into the analog control signal for the at least one of the first and second delay lines.

7. The clockless delay adaptation loop of claim 6, wherein the second counter is configured to double a count of the second autocorrelation.

8. The clockless delay adaptation loop of claim 1, wherein the autocorrelator is a first autocorrelator, wherein the controller is a first controller configured to generate a first control signal for the first delay line, and wherein the clockless delay adaptation loop further comprises:
a second autocorrelator configured to receive the first delayed signal and the second delayed signal, wherein the second autocorrelator comprises:
a third logic circuit configured to output a third autocorrelation; and
a fourth logic circuit configured to output a fourth autocorrelation; and
a second controller configured to generate a second control signal for the second delay line based on the third and fourth autocorrelation.

9. The clockless delay adaptation loop of claim 1, wherein the autocorrelator is a first autocorrelator, and wherein the clockless delay adaptation loop further comprises:
a second autocorrelator configured to receive the first delayed signal and the second delayed signal, wherein the second autocorrelator comprises:
a third logic circuit configured to output a third autocorrelation; and
a fourth logic circuit configured to output a fourth autocorrelation;
a first summer configured to receive the first autocorrelation and the third autocorrelation; and
a second summer configured to receive the second autocorrelation and the fourth autocorrelation, wherein the controller is further configured to generate the control signal based on an output of the first summer and an output of the second summer.

10. The clockless delay adaptation loop of claim 1, wherein at least one of the first and second delay lines comprises:
a voltage-to-current (V-I) converter configured to receive the control signal and generate a control current; and
a differential amplifier configured to:
receive the control signal, the control current, and one of the input signal and the first delayed signal; and
output one of the first delayed signal and the second delayed signal.

11. An apparatus, comprising:
a first delay line coupled to an input;
a second delay line coupled to an output of the first delay line;
an XNOR gate coupled to the input and the output of the first delay line; and
an OR gate coupled to the input and the output of the first delay line; and
a controller coupled to an output of the XNOR gate and an output of the OR gate, wherein the controller is further coupled to at least one of the first and second delay lines.

12. The apparatus of claim 11, wherein the controller comprises:
a transconductance stage coupled to the output of the XNOR gate and the output of the OR gate; and
a capacitor coupled to an output of the transconductance stage and to a ground node, wherein the output of the transconductance stage is further coupled to the at least one of the first and second delay lines.

13. The apparatus of claim 11, wherein the controller comprises:
a first counter coupled to the output of the XNOR gate;
a second counter coupled to the output of the OR gate; and
an accumulator and comparator coupled to an output of the first counter and an output of the second counter.

14. The apparatus of claim 13, wherein the controller further comprises a digital-to-analog converter coupled to an output of the accumulator and comparator, wherein an output of the digital-to-analog converter is further coupled to the at least one of the first and second delay lines.

15. The apparatus of claim 13, wherein the at least one of the first and second delay lines comprises a digital-controlled delay line coupled to an output of the accumulator and comparator.

16. The apparatus of claim 11, wherein the XNOR gate is a first XNOR gate, the OR gate is a first OR gate, wherein the controller is a first controller coupled to the first delay line, and wherein the apparatus further comprises:
a second XNOR gate coupled to the output of the first delay line and an output of the second delay line;
a second OR gate coupled to the output of the first delay line and the output of the second delay line; and
a second controller coupled to an output of the second XNOR gate and an output of the second OR gate, wherein the second controller is further coupled to the second delay line.

17. The apparatus of claim 11, wherein the XNOR gate is a first XNOR gate, the OR gate is a first OR gate, and wherein the apparatus further comprises:
a second XNOR gate coupled to the output of the first delay line and an output of the second delay line;
a second OR gate coupled to the output of the first delay line and the output of the second delay line;

a first summer coupled to the output of the first XNOR gate and an output of the second XNOR gate; and a second summer coupled to the output of the first OR gate and an output of the second OR gate, wherein the controller is coupled to an output of the first summer and an output of the second summer.

18. The apparatus of claim 11, wherein at least one of the first and second delay lines comprises:

a voltage-to-current (V-I) converter coupled to the controller; and a differential amplifier coupled to:
the controller;
an output of the V-I converter; and
one of the input and the output of the first delay line.

19. A delay adaptation loop, comprising:

a first delay line;

a second delay line;

a first autocorrelation calculator configured to apply a first autocorrelation function to input data and output data of at least one of the first and second delay lines, resulting in a first autocorrelation;

a second autocorrelation calculator configured to apply a second autocorrelation function to the input data and the output data of the at least one of the first and second delay lines, resulting in a second autocorrelation; and a controller coupled to the first and second autocorrelation calculators and to at least one of the first and second delay lines, wherein the controller is configured to generate a control signal for the at least one of the first and second delay lines based on the first and second autocorrelations.

20. The delay adaptation loop of claim 19, wherein the first autocorrelation calculator comprises an XNOR gate, and wherein the second autocorrelation calculator comprises an OR gate.

21. The delay adaptation loop of claim 20, wherein the OR gate has a gain that is two times a gain of the XNOR gate.

22. The delay adaptation loop of claim 19, wherein the controller comprises:

a transconductance stage having inputs coupled to the first and second autocorrelation calculators and further having an output coupled to the at least one of the first and second delay lines; and a capacitor coupled to the output of the transconductance stage and to ground.

23. The delay adaptation loop of claim 19, wherein the controller comprises:

a first counter coupled to the first autocorrelation calculator;

a second counter coupled to the second autocorrelation calculator;

an accumulator and comparator coupled to the first and second counters; and a digital-to-analog converter coupled to an output of the accumulator and comparator and further coupled to the at least one of the first and second delay lines.

24. The delay adaptation loop of claim 19, wherein the control signal comprises a control voltage signal, and wherein at least one of the first and second delay lines comprises:

a voltage-to-current converter configured to convert the control voltage signal into a control current; and a differential amplifier configured to delay an input signal of the at least one of the first and second delay lines based on the control signal and the control current.

25. An apparatus, comprising:

a voltage-to-current (V-I) converter configured to receive a control voltage Vctrl and generate a control current Ictrl; and a differential amplifier configured to delay an input signal based on Vctrl and Ictrl;

wherein the V-I converter comprises:

an operational amplifier (op-amp) comprising a positive input, a negative input configured to receive Vctrl, and an output;

a first transistor comprising a first control terminal coupled to the output of the op-amp, a first current terminal coupled to the positive input of the op-amp, and a second current terminal coupled to ground;

a first resistor coupled to a supply voltage rail and to the positive input of the op-amp and the first current terminal of the first transistor;

a second transistor comprising a second control terminal coupled to the output of the op-amp, a third current terminal, and a fourth current terminal coupled to ground;

a current source coupled to the third current terminal;

a third transistor comprising a fifth current terminal, a sixth current terminal, and a third control terminal coupled to the current source and the third current terminal, wherein the fifth current terminal is coupled to the third control terminal, the current source, and the third current terminal; and a second resistor coupled to the sixth current terminal and to ground.

* * * * *